US012684687B2

(12) United States Patent
Ku et al.

(10) Patent No.: US 12,684,687 B2
(45) Date of Patent: Jul. 14, 2026

(54) CIRCUIT APPARATUS FOR ELECTRONIC DEVICES

(71) Applicant: Intel Corporation, Santa Clara, CA (US)

(72) Inventors: Jeff Ku, Taipei (TW); Min Suet Lim, Penang (MY); Tin Poay Chuah, Bayan Baru (MY); Yew San Lim, Penang (MY); Twan Sing Loo, Penang (MY)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 17/946,808

(22) Filed: Sep. 16, 2022

(65) Prior Publication Data

US 2023/0017925 A1 Jan. 19, 2023

(51) Int. Cl.
*H05K 1/02* (2006.01)
*G06F 1/20* (2006.01)
*H05K 7/20* (2006.01)

(52) U.S. Cl.
CPC .......... H05K 1/0272 (2013.01); G06F 1/203 (2013.01); H05K 1/0201 (2013.01); H05K 7/20136 (2013.01)

(58) Field of Classification Search
CPC ............... H05K 1/0272; H05K 1/0201; H05K 7/20136; G06F 1/203
USPC ...................................................... 361/679.48
See application file for complete search history.

(56) References Cited

U.S. PATENT DOCUMENTS

| | | | | |
|---|---|---|---|---|
| 5,287,009 A * | 2/1994 | Heung | ............... | H05K 7/20172 318/400.38 |
| 2008/0266792 A1* | 10/2008 | Li | ....................... | H05K 7/20909 361/695 |
| 2012/0218219 A1* | 8/2012 | Rappoport | ........... | H10K 59/131 345/174 |
| 2013/0003298 A1* | 1/2013 | Simon | ................ | H05K 7/20581 361/695 |
| 2020/0329581 A1* | 10/2020 | Hsieh | ....................... | F04D 25/08 |
| 2021/0120699 A1* | 4/2021 | Lim | ................... | H05K 7/20172 |
| 2021/0161031 A1* | 5/2021 | Wang | ................. | F04D 25/0613 |

* cited by examiner

*Primary Examiner* — Zhengfu J Feng

(74) *Attorney, Agent, or Firm* — Hanley, Flight & Zimmerman, LLC

(57) ABSTRACT

Circuit apparatus are disclosed. An example circuit apparatus includes a body including a plurality of first traces formed on the body, and a plurality of openings formed through the body and located between respective ones of the first traces. The openings provide airflow to a fan module of an electronic device through the body of the circuit apparatus.

20 Claims, 14 Drawing Sheets

CIRCUIT APPARATUS FOR ELECTRONIC DEVICES

FIELD OF THE DISCLOSURE

This disclosure relates generally to hardware and, more particularly, to flexible circuit apparatus for electronic devices.

BACKGROUND

Electronic devices require thermal systems to manage thermal conditions for maintaining optimal efficiency. To manage thermal conditions, electronic devices employ thermal cooling systems that cool electronic components of the electronic devices during use.

Figure 1:
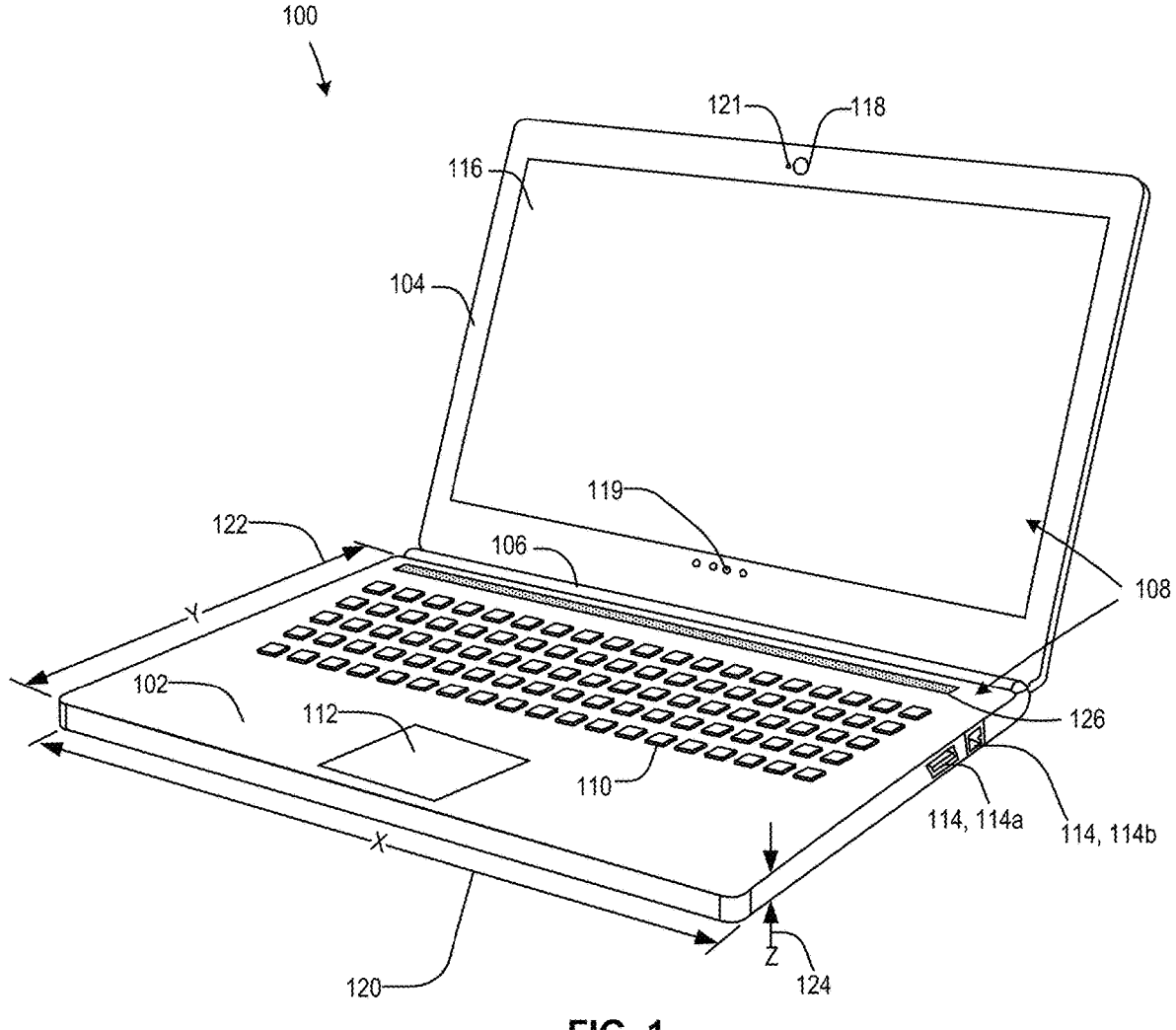
FIG. 1 is an example electronic device constructed in accordance with teachings of this disclosure.

The FIGURES are not to scale. Instead, the thickness of the layers or regions may be enlarged in the drawings. Although the FIGURES show layers and regions with clean lines and boundaries, some, or all of these lines and/or boundaries may be idealized. The boundaries and/or lines may be unobservable, blended, and/or irregular.

In general, the same reference numbers will be used throughout the drawing(s) and accompanying written description to refer to the same or like parts. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, "approximately," "substantially," and "about" refer to dimensions that may not be exact due to manufacturing tolerances and/or other real-world imperfections. For example, the dimensions may be within a tolerance of plus or minus ten percent (10%).

DETAILED DESCRIPTION

During operation of an electronic device (e.g., a laptop, a tablet, etc.), hardware components disposed in a body or housing of the device, such as a processor, graphics card, and/or battery, generate heat. Heat generated by the hardware components of the electronic device can cause a temperature of one or more electronic components to exceed operating temperature limits of the electronic components. In some instances, heat generated by the electronic device (e.g., a mobile or portable device) can cause portions of an exterior surface, or skin, of a device housing to increase and become warm or hot to a user's touch.

To prevent overheating of the hardware components, the electronic device includes a thermal management system to dissipate heat from the electronic device. Example thermal management systems can include active cooling systems. Active cooling systems employ forced convention methods to increase a rate of fluid flow, which increases a rate of heat removal. To exhaust heat or warm air generated within the body of the electronic device and cool the electronic device, active cooling systems often employ external devices such as fans or blowers. Thus, for certain electronic devices (e.g., laptops, tablets, mobile devices, etc.), a fan can provide a thermal solution to safeguard system performance to a target thermal design power. However, placement of a fan can be challenging in electronic devices such as, for example, laptops, tablets, mobile devices, etc.) due to space constraints within housings of the electronic devices.

To provide a signal path between respective ends of the circuit board positioned on either side of the fan module, a circuit board can be extended in an area adjacent the fan module. Such signal path of the circuit board includes communication paths (e.g., signal paths or electrical traces)

for communicating between electronic components of the circuit board positioned on either side of the fan module.

As electronic systems become more complex and electrical interfaces in the electrical systems operate at higher frequencies, dense signal processing areas (such as those adjacent a fan module) can cause significant crosstalk or unwanted signal cross-over between adjacent signal paths in such densely packed spaces. For example, crosstalk may be noise induced by one signal that interferes with another signal, which reduces the performance of the electronic device.

For example, electronic devices employ thinner circuit boards and/or small surface area or footprint (e.g., width and height (x-y) board architecture) to provide a smaller form factor. As used herein, x-direction refers to a direction along a width of an electronic device (e.g., a direction between lateral or side edges), y-direction refers to a direction along a height of an electric device (e.g., a direction between a front edge and a rear edge of an electronic device), and z-direction refers to a direction along a depth of an electronic device (e.g., between a lower surface and an upper surface of a housing of an electronic device). Reducing the size of a printed circuit board (e.g., and in addition with the inclusion of a fan) increases manufacturing complexity for routing signal transfer paths (e.g., traces) on the printed circuit board that couple to electronic components or hardware interfaces such as, for example, ports including USB ports, HDMI ports, Thunderbolt ports, etc. Dense communication areas of a printed circuit board provide a relatively narrow signal path (e.g., between adjacent traces or signal paths), which results in a dense signal processing area of the circuit board. Thus, such dense communication areas cannot be expanded and, as a result, provide a relatively narrow signal path (e.g., in a height direction or y-direction), which results in a dense signal processing area of the circuit board. As a result, thinner boards and smaller x-y circuit board architecture that result in narrow and/or tight signal path routes can cause signal integrity loss, thereby reducing the performance of the electronic device. Further, multiple layers formed on the circuit board to alleviate dense signal paths may not be an option because a circuit board with multiple layers increases a board thickness (e.g., in the z-direction) that can exceed a desired thickness and/or may affect a desired overall thickness (e.g., in the z-direction) of an electronic device.

In some examples, to preserve space and improve signal integrity, a fan module of an active cooling system can be placed between a main circuit board (e.g., a mother board) and one or more auxiliary circuit boards (e.g., daughter boards) such that the main circuit board is spaced or separated from the auxiliary circuit board. To electrically couple or interconnect the main circuit board and the auxiliary circuit board(s), the electronic device can employ one or more communication cables (e.g., an ATA or Advanced Technology Attachment, SATA cable, flexible circuit board, etc.). However, to prevent the cable from interfering with airflow of a fan, the communication cable is often circumspectly routed around the fan. Thus, additional space requirements may be needed to ensure that the communication cable(s) does not impede the fan airflow. In some examples, one or more communication cables are positioned to extend across the fan and/or fan module, which can partially block or overlap with an opening of the fan housing and/or restrict (e.g., adequate) airflow to the fan, thereby reducing an overall efficiency of the thermal management system which can cause components to operate at higher temperatures and/or cause temperature of a skin to increase resulting in unsatisfactory user experience.

Example apparatus disclosed herein provide active cooling systems that reduce space requirements while improving performance. Specifically, the example active cooling systems disclosed herein preserve space while improving thermal efficiency and/or reducing skin temperature during use. Example apparatus disclosed herein include circuit apparatus (e.g., flexible flat cable, flexible printed circuit board, micro LED circuits, communication cables, etc.) that allow airflow to pass through the communication cable. In some examples, apparatus disclosed herein include a plurality of perforations or openings in a mesh or honeycomb pattern. In this manner, the circuit apparatus disclosed herein do not impede or restrict airflow when positioned at least partially or entirely over a vent opening and/or an opening of a fan module. In other words, example circuit apparatus disclosed can extend across an opening of a fan module or housing without impeding or restricting airflow to the fan. In some examples, the circuit apparatus include a plurality of traces (e.g., signal lines, differential pairs, microstrip, stripline, etc.) and one or more ground signals. The openings are positioned between the traces and/or the grounds signal(s). Thus, the openings do not interfere with signals (e.g., differential signals) from the traces and/or ground. In some examples, the circuit apparatus disclosed herein can implement a micro LED display. In some such examples, the micro LED display provides air inlets to an internal cavity of an electronic device. Example circuit apparatus disclosed herein can be employed with board to board connections, dual fan configurations, single fan configurations, connection for longhorn shaped circuit boards, connections for circuit board with cutouts, and/or any other circuit board or system that requires airflow therethrough. Example circuit apparatus disclosed herein can include airflow or air pass-through features including, but not limited to, perforations, openings, slots, through holes, passageways, cutouts, and/or any other opening to allow airflow through. In some examples, circuit apparatus disclosed herein include pass-through features are formed only in areas of the circuit apparatus that are in fluid communication with airflow of a fan assembly.

FIG. 1 is an example electronic device 100 constructed in accordance with teachings of this disclosure. The electronic device of the illustrated example is a personal computing device such as, for example, a laptop. The electronic device 100 of the illustrated example includes a first housing 102 coupled to a second housing 104 via a hinge 106. The hinge 106 enables the second housing 104 to rotate or fold relative to first housing 102 between a stored position (e.g., where the second housing 104 is aligned or parallel with the first housing 102) and an open position as shown in FIG. 1 (e.g., where the second housing 104 is non-parallel relative to the first housing 102). In the open position, the second housing 104 can rotate relative to the first housing 102 about the hinge 106 to a desired viewing angle.

The first housing 102 and/or the second housing 104 houses and/or carries electronic components 108 of the electronic device 100. For example, the electronic components 108 of the illustrated example include a keyboard 110 and a track pad 112, I/O connectors 114 (e.g., universal serial bus (USB) 114*a*, ethernet connector 114*b*, a Thunderbolt connector, a power port, etc.), a display 116, a camera 118, a speaker 119 and a microphone 121. Other electronic components 108 can include, but are not limited to, processor(s), a graphics card, a battery, light emitting diodes, memory, a storage drive, an antenna, etc. For example, the second housing 104 houses the display 116, the camera 118, the speakers 119, and the microphone 121. The first housing 102 of the illustrated example houses the keyboard 110, the track pad 112, the I/O connectors 114, etc. The first housing 102 has a width in a x-direction 120, a height in a y-direction 122, and a depth in a z-direction 124. References to the x-y-z directions 120, 122, 124 throughout this specification pertain a direction along the width, the height, and the depth, respectively. To provide airflow to the electronic components 108 located within the first housing 102, the first housing 102 of the illustrated example includes an air vent 126.

Although the electronic device 100 of the illustrated example is a laptop, in some examples, the electronic device 100 can be a tablet, a desktop, a mobile device, a cell phone, a smart phone, a hybrid or convertible PC, a personal computing (PC) device, a sever, a modular computing device, a digital picture frame, a graphic calculator, a smart watch, and/or any other electronic device that employs active cooling.

Figure 2:
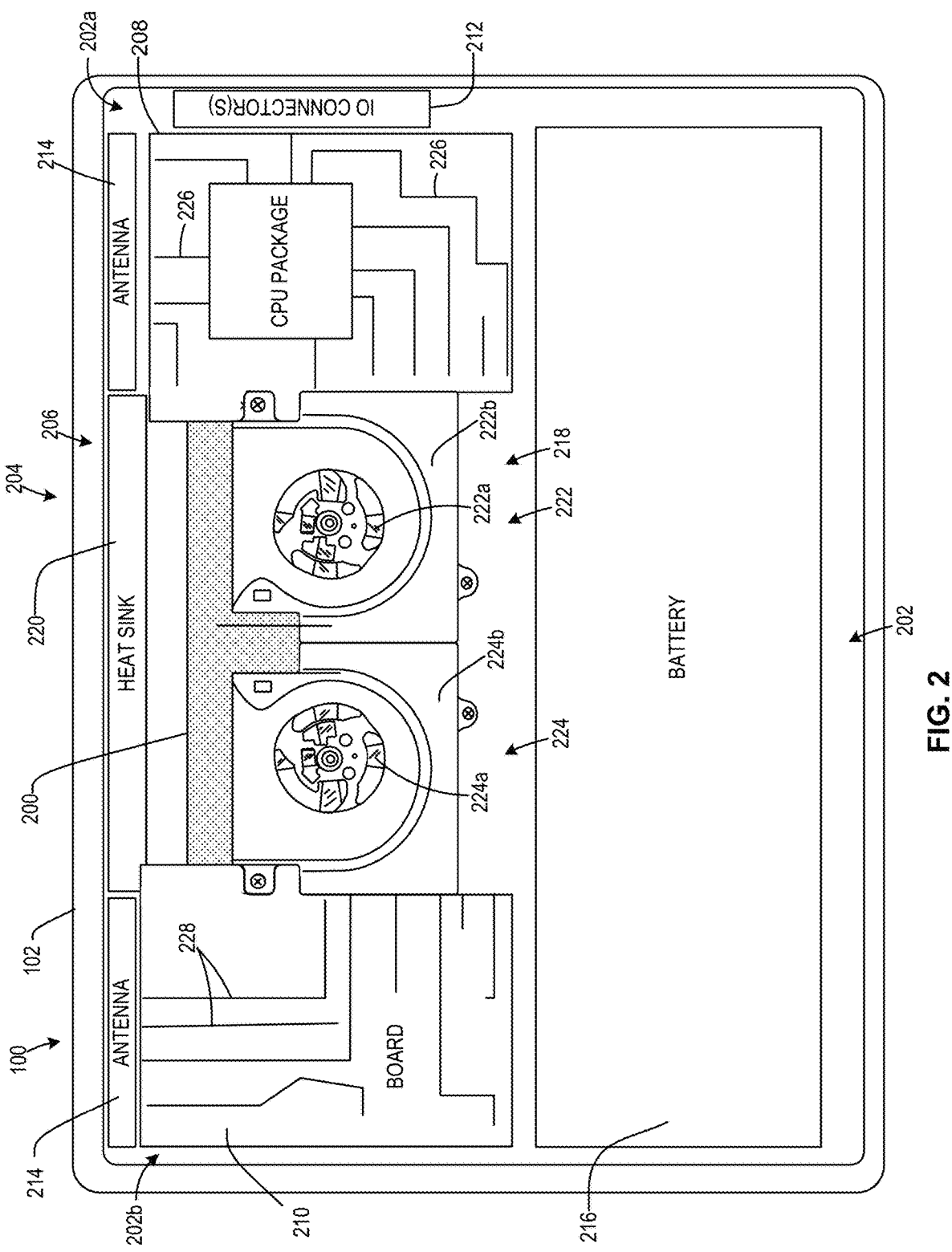
FIG. 2 is a bottom view of the example electronic device of FIG. 1 illustrating an example circuit apparatus disclosed herein.

FIG. 2 is a schematic, bottom view of the first housing 102 of the electronic device 100 of FIG. 1 showing an example circuit apparatus 200 in accordance with teachings of this disclosure. A cover is removed from the first housing 102 to expose a cavity 202 (e.g., an internal extending in the z-direction 124 of FIG. 1) of the first housing 102 that houses one or more electronic components 204 of the electronic device 100 including an example thermal management system 206 disclosed herein. The electronic components 204 include an example first circuit board 208 (e.g., a main circuit board), an example second circuit board 210, example input/output (I/O) connectors 212, example antennas 214, and an example battery 216. The electronic components 204 can include other components not shown. The thermal management system 206 of the illustrated example includes an active cooling system that includes a dual fan assembly 218 and a heat sink 220. The dual fan assembly 218 includes a first fan module 222 (e.g., a first fan 222a and a first fan housing 222b) and a second fan module 224 (e.g., a second fan 224a and a second fan housing 224b) positioned adjacent the first fan module 222. The dual fan assembly 218 is positioned between the first circuit board 208 and the second circuit board 210.

Specifically, the first circuit board 208 is located in a first portion 202a of the cavity 202 and the second circuit board 210 is located in a second portion 202b of the cavity 202 spaced a distance from the first circuit board 208. In other words, the first circuit board 208 is spaced apart from the second circuit board 210 (e.g., the first circuit board 208 is physically detached from the second circuit board 210). To electrically couple electronic components (e.g., integrated circuits (IC) chips, resistors, capacitors, inductors, diodes, switches, etc.) of the first circuit board 208, the first circuit board 208 includes one or more first signal paths 226 (e.g., electrical signal paths or traces). To electrically couple electronic components (e.g., integrated circuits (IC) chips, resistors, capacitors, inductors, diodes, switches, etc.) of the second circuit board 210, the second circuit board 210 includes one or more second signal paths 228 (e.g., electrical signal paths or traces). Specifically, the first circuit board 208 of the illustrated example carries or supports a processor 230 (e.g., an integrated circuit (IC) chip, a system on chip (SOC), a main processor, etc.) that sends and/or receives signals (e.g., electrical signals or instructions) directly or indirectly to and/or from, for example, the speakers 119 (FIG. 1), the I/O connectors 212, the antennas 214, etc., via the one or more first signal paths 226 of the first circuit board 208 and/or the one or more second signal paths 228 of the second circuit board 210.

To electrically and/or communicatively couple the first circuit board 208 and the second circuit board 210, the electronic device 100 of the illustrated example employs the circuit apparatus 200. For example, the example circuit apparatus 200 disclosed herein electrically and/or communicatively couples at least portions of the first signal paths 226 of the first circuit board 208 and at least portions of the second signal paths 228 of the second circuit board 210. In the illustrated example of FIG. 2, the example circuit apparatus 200 extends across at least a portion of the dual fan assembly 218. As described in greater detail below, the circuit apparatus 200 does not impede or affect airflow to and/or from the first fan module 222 and/or the second fan module 224 of the dual fan assembly 218. In other words, the circuit apparatus 200 of the illustrated example enables airflow through the circuit apparatus 200 so that the circuit apparatus 200 does not impede, restrict or reduce airflow to and/or from the first fan 222a and/or the second fan 224a.

By positioning the circuit apparatus 200 across the dual fan assembly 218, the circuit apparatus 200 of the illustrated example conserves a significant amount of space in the cavity 202 of the first housing 102. In particular, the circuit apparatus 200 of the illustrated example reduces a circuit board area that would otherwise be needed to route signal traces to interconnect the first circuit board 208 and the second circuit board 210. For example, the circuit apparatus 200 of the illustrated example reduces a spacing requirement of the first circuit board 208 and the second circuit board 210 in the y-direction 122. Additionally, the circuit apparatus 200 does not affect signal integrity and reduces a signal density or signal path bottleneck area (e.g., typically routed through a circuit board area between the battery 216 and the first circuit board 208 and the second circuit board 210). Reducing the size requirements of the circuit board 208, 210 in the y-direction 122 can improve thermal requirements or performance and/or battery life performance of the electronic device 100. Additionally, the circuit apparatus 200 of the illustrated example improves thermal efficiency of the thermal management system 206 by allowing airflow to the dual fan assembly 218. In some examples, providing additional space in the cavity 202 (e.g., an internal cavity) enables use of a larger size fan module that can provide a larger airflow output, which can greatly improve thermal performance of the active cooling system of the electronic device 100.

Figure 3:
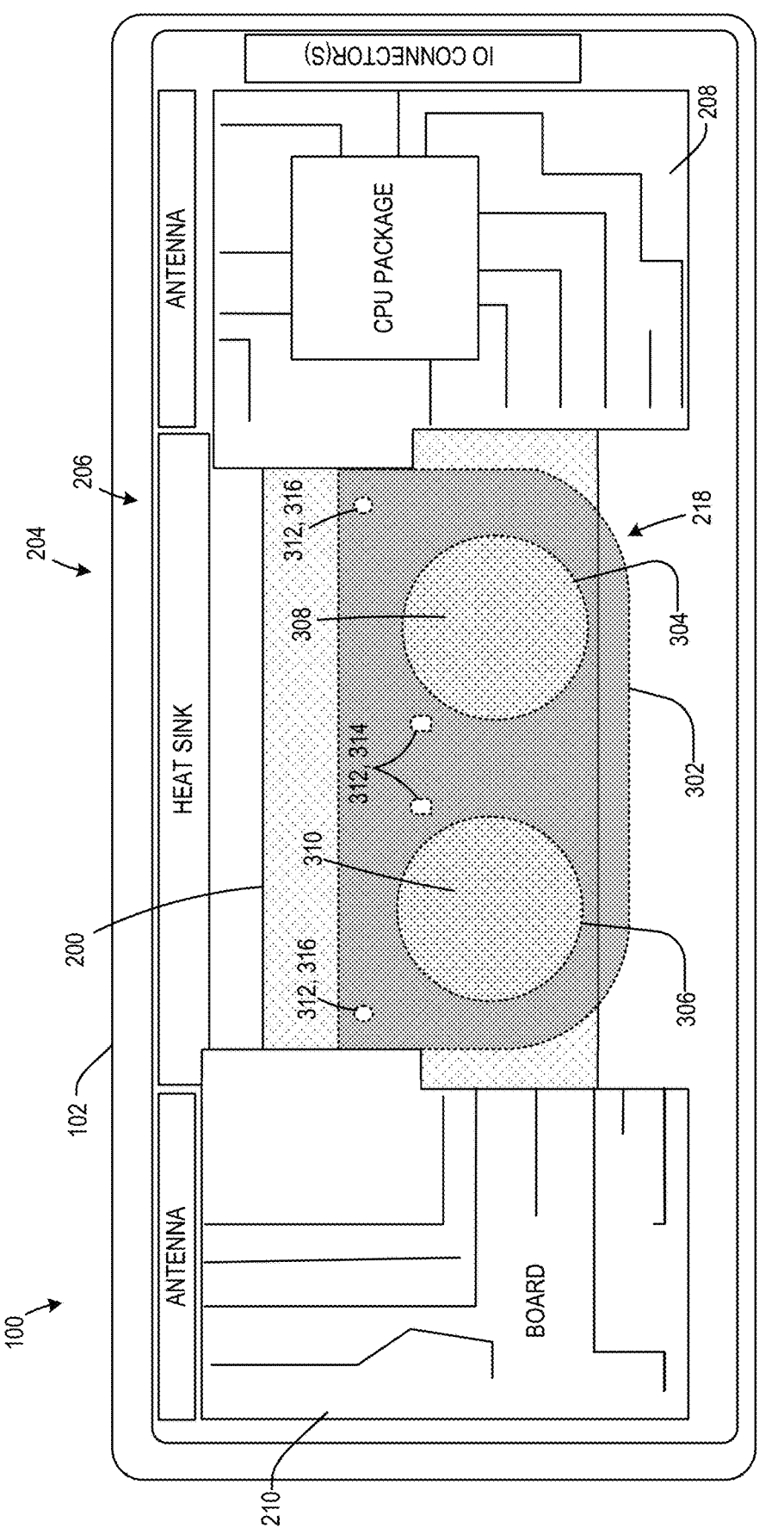
FIG. 3 is partial, bottom view of the example electronic device of FIG. 2.

FIG. 3 is an enlarged, top view of the electronic device 100 of FIG. 2. In FIG. 3, the first fan 222a, the first fan housing 222b, the second fan 224a and the second fan housing 224b of the thermal management system 206 of FIG. 2 are removed for clarity. A frame 302 (e.g., footprint or outline) of the dual fan assembly 218 is provided in dashed lines for reference. The frame 302 of the illustrated example overlays the circuit apparatus 200. In the illustrated example of FIG. 3, the circuit apparatus 200 couples the first circuit board 208 and the second circuit board 210. Specifically, the circuit apparatus 200 of the illustrated example extends between the first circuit board 208 and the second circuit board 210. In particular, the circuit apparatus 200 of the illustrated example overlaps or extends across the dual fan assembly 218 (e.g., the frame 302). As shown in FIG. 3, the circuit apparatus 200 extends across a first fan inlet 304 (e.g., a first fan opening) of the first fan module 222 and a second fan inlet 306 (e.g., a second opening) of the second fan module 224 of the dual fan assembly 218. For example, the circuit apparatus 200 of the illustrated example covers (e.g., completely covers) the first fan inlet 304 and the second fan inlet 306 of the respective first fan module 222 and the second fan module 224. For example, a first portion 308 of the circuit apparatus 200 completely covers (e.g., extends over) the first fan inlet 304 of the dual fan assembly 218 (e.g., covers 100 percent of an area of the first fan inlet 304) and a second portion 310 of the circuit apparatus 200 completely covers a second fan inlet 306 of the dual fan assembly 218 (e.g., covers 100 percent of an area of the second fan inlet 306). In some examples, the circuit apparatus 200 can be structured and/or positioned relative to the frame 302 to at least partially cover the first fan inlet 304 (e.g., cover between approximately 1 percent and 99 percent of the first fan inlet 304) and/or to at least partially cover the second fan inlet 306 (e.g., cover between approximately 1 percent and 99 percent of the second opening). Although the circuit apparatus 200 covers the first fan inlet 304 and the second fan inlet 306, the circuit apparatus 200 does not impede or block airflow to and/or from the first fan 222a (FIG. 2) and/or the second fan 222b (FIG. 2) via the respective first fan inlet 304 and the second fan inlet 306. Thus, for example, airflow drawn into and/or out of the air vent 126 in the first housing 102 of the electronic device 100 is not affected by the circuit apparatus 200.

To facilitate alignment of the circuit apparatus 200 with vent holes of a cover of the electronic device 100 (e.g., vent holes in a C-cover or top cover of a frame and/or D-cover or bottom cover of the frame of the electronic device 100), the circuit apparatus 200 of the illustrated example includes alignment pins 312. Specifically, the circuit apparatus 200 of the illustrated example includes a first set 314 of the alignment pins 312 and a second set 316 of the alignment pins 312. The first set 314 of the alignment pins 312 defines a first keyed shape having a rectangular shape (e.g., a square shape) and the second set 316 of the alignment pins 312 define a second keyed shape having a cylindrical shape. In other examples, the first set 314 of the alignment pins 312 and the second set 316 of the alignment pins 312 can have the same shape. In some examples, the circuit apparatus 200 does not include the alignment pins 312.

Figure 4:
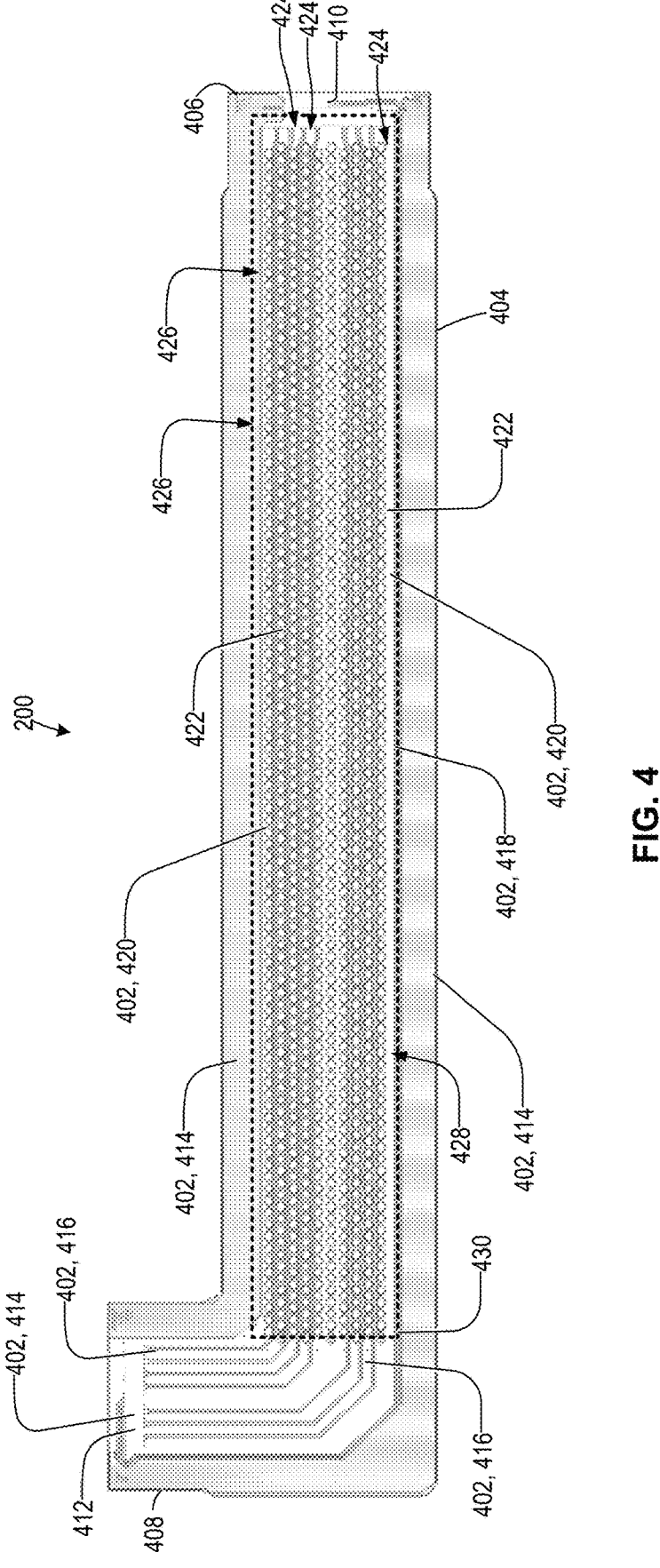
FIG. 4 is a top view of the example circuit apparatus of FIGS. 1-3.

FIG. 4 is a top view of an example circuit apparatus 200 of FIGS. 1-3. The circuit apparatus 200 of the illustrated example employs signal paths 402 (e.g., electrically conductive traces or electrical paths) for routing signals between the first circuit board 208 and second circuit board 210 and/or other system or electronic components (e.g., the electronic components 204 of FIG. 2, I/O connectors such as a Thunderbolt connector, etc.). The circuit apparatus 200 of the illustrated example includes a body 404 between a first end 406 (e.g., a first flange) and a second end 408 (e.g., a second flange) opposite the first end 406. The signal paths 402 of the illustrated example are formed on the body 404 between the first end 406 of the body 404 and the second end 408 of the body 404. To couple the circuit apparatus 200 of the illustrated example with the first circuit board 208 and the second circuit board 210, the circuit apparatus 200 includes a first connector 410 and a second connector 412. Specifically, the first connector 410 is provided at the first end 406 of the body 404 and the second connector 412 is provided at the second end 408 of the body 404. The first connector 410 of the body 404 couples (e.g., communicatively couples) to the first circuit board 208 and the second connector 412 of the body 404 couples (e.g., communicatively couples) to the second circuit board 210. Thus, the first connector 410 couples one more signal paths 402 of the circuit apparatus 200 and the first signal paths 226 (e.g., electrical traces) of the first circuit board 208 and the second connector 412 couples one or more signal paths 402 of the circuit apparatus 200 and the second signal paths 228 (e.g., electrical traces) of the second circuit board 210. The first connector 410 and/or the second connector 412 of the illustrated example can be a rigid board to flex board connector, a soldered down connector, a compressive connector, a zero insertion force (ZIF) connector, a mechanical crimping connector, solder, connector pins or pads in one of the connectors 410, 412 or the circuit boards 208, 210 that mate or match with pads or vias in the other one of the connectors 410, 412 or circuit boards 208, 210, an insertion connector (e.g., an M.2 standard insertion connector), a pin-and-receptacle connector, a combination therewith, and/or any connector(s) to couple the circuit apparatus 200 with the first circuit board 208 and the second circuit board 210.

The signal paths 402 of the illustrated example can form different signal design rules (e.g., stripline, dual stripline, high-speed differential type signals, grounding for isolation, signal references, high speed input/output interfaces, singled ended signals, a combination thereof, etc.). For example, the signal paths 402 of the circuit apparatus 200 of the illustrated example include a plurality of first traces 414 electrically coupling components (e.g., electronic components 204, capacitors, transistors, etc.) of the circuit apparatus 200, a plurality of second traces 416 providing differential signals, a third plurality of traces 418 providing a power signal, and a fourth plurality of traces 420 providing a ground (e.g., carrying a ground signal).

To allow airflow through the circuit apparatus 200, the circuit apparatus 200 of the illustrated example includes a plurality of openings 422 (e.g., perforations, passageways, air inlets, pass-through features, pass-through openings, etc.). The openings 422 provide air holes or airflow passageways formed in the body 404 (e.g., entirely through a thickness, e.g., a thickness in the z-direction 124 of FIG. 1). The openings 422 of the illustrated example are positioned between the signal paths 402 (e.g., respective ones of the traces 418). For example, some of the signal paths 402 and/or the traces 416-420 are routed around the openings 422. In other words, none of the signal paths 402 are interrupted by the openings 422. Likewise, the openings 422 do not interfere with an operation of the signal paths 402. For instance, the openings 422 are formed through areas of the body 404 that do not include signal paths 402 and/or traces 416-420. Thus, the openings 422 of the illustrated example do not affect signal integrity of the signal paths 402. The openings 422 (e.g., and the body 404) of the illustrated example are provided in rows 424 (e.g., the x-direction 120 of FIG. 1) and columns 426 (e.g., the y-direction 122) between the first end 406 and the second end 408 to provide a mesh or honeycomb pattern or matrix 428 (e.g., a grid-like pattern). The traces 418 of the illustrated example are positioned between adjacent rows 424 of the openings 422. In the illustrated example, the matrix 428 is provided within an area or perimeter 430. The area or perimeter 430 of the illustrated example has a rectangular shape. For example, the matrix 428 and/or the perimeter 430 is a portion of the circuit apparatus 200 that extends across the fan inlets 304 and 306 and/or the air vent 126. In some examples, only portions of the circuit apparatus 200 extending across airflow pathways include the openings 422. However, in some examples, the matrix 428 and/or the area or perimeter 430 can have a square shape, a triangular shape, and/or any other shape. Additionally, the matrix 428 can be provided in areas of the body 404 that extends across the first fan inlet 304, the second fan inlet 306, the inlet vent 126 and/or any other areas through that require pass-through airflow. Additionally, the openings 422 of the illustrated example have the same sized openings. However in some examples, one or more openings 422 can have different sized openings.

The circuit apparatus 200 can be a cable, a flexible circuit board, a printed circuit board, a rigid circuit board, a flexible printed circuit board, and/or any other circuit board or circuit for communicatively and/or electronically coupling a two or more circuits (e.g., a first circuit board such as, for example, the first circuit board 208 and a second circuit board such as, for example the second circuit board 210). In some examples, the circuit apparatus 200 can be formed via additive manufacturing technology and/or any other technology for forming a single layer and/or multi-layer printed circuit board (e.g., a flexible circuit board). In some examples, the signal paths 402 disclosed herein can be laminated and used as electrical signal paths when the circuit apparatus 200 is assembled with the electronic device 100, where the circuit apparatus 200 electrically connects the first circuit board 208 and the second circuit board 210 of the electronic device 100. In some examples, the body 404 can be resin, silicone, plastic and/or any other suitable or electrically insulating material(s) and the traces 418 can be composed of copper, gold and/or other electrically conductive material(s) for carrying electrical signals, current, etc.

Figure 5:
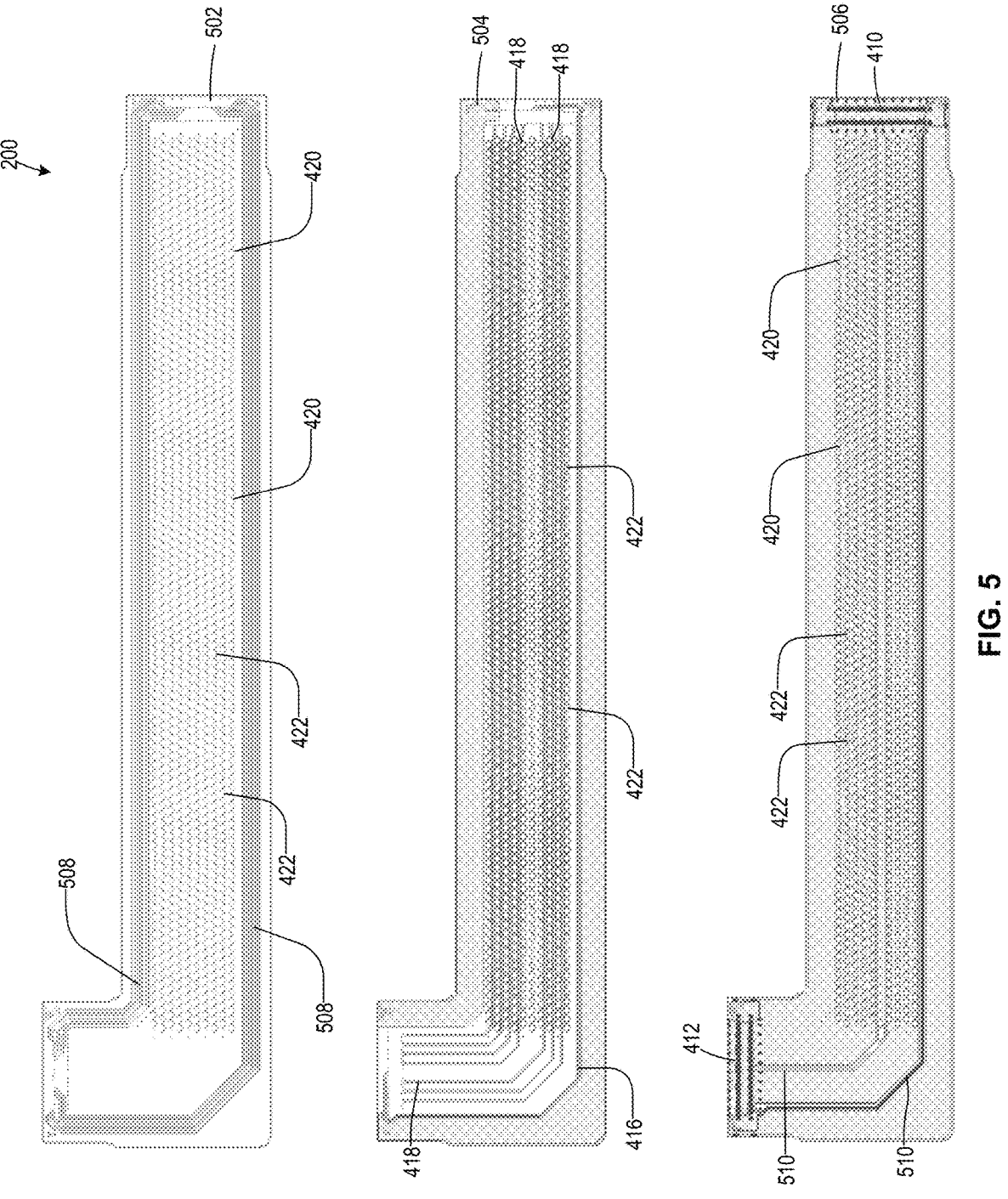
FIG. 5 is an exploded, top view of the example circuit apparatus of FIG. 4.

FIG. 5 is a top, exploded view of the example circuit apparatus 200 of FIGS. 1-4. The circuit apparatus 200 of the illustrated example is a multi-layer printed circuit board. Specifically, the circuit apparatus 200 of the illustrated example includes a first layer 502, a second layer 504, and a third layer 506. The signal paths 402 can be printed within the multiple layers of the circuit apparatus 200 and are capable of forming different signal design rules (e.g., stripline, dual stripline, high-speed differential type signal, grounding for isolation, signal references, a combination thereof, etc.). For instance, the first layer 502 of the illustrated example includes the traces 420 for providing or carrying ground signals and traces 508 for providing or carrying miscellaneous signals. The second layer 504 of the illustrated example includes the traces 418 for providing or carrying differential signals (e.g., for a thunderbolt connector) and the traces 416 for providing or carrying power. The third layer 506 includes the traces 420 for providing or carrying ground signals, traces 510 for providing or carrying other signals, and traces for the first connector 410 and the second connector 412. Each of the layers 502-506 includes the openings 422. Specifically, the openings 422 of the respective layers 502-506 align (e.g., coaxially and/or concentrically algin) to provide airflow passageways through the layers 502-506. In some examples, the circuit apparatus 200 includes only one layer (e.g., a single layer), two layers, four layers, and/or any other number of layers.

Figure 6A:
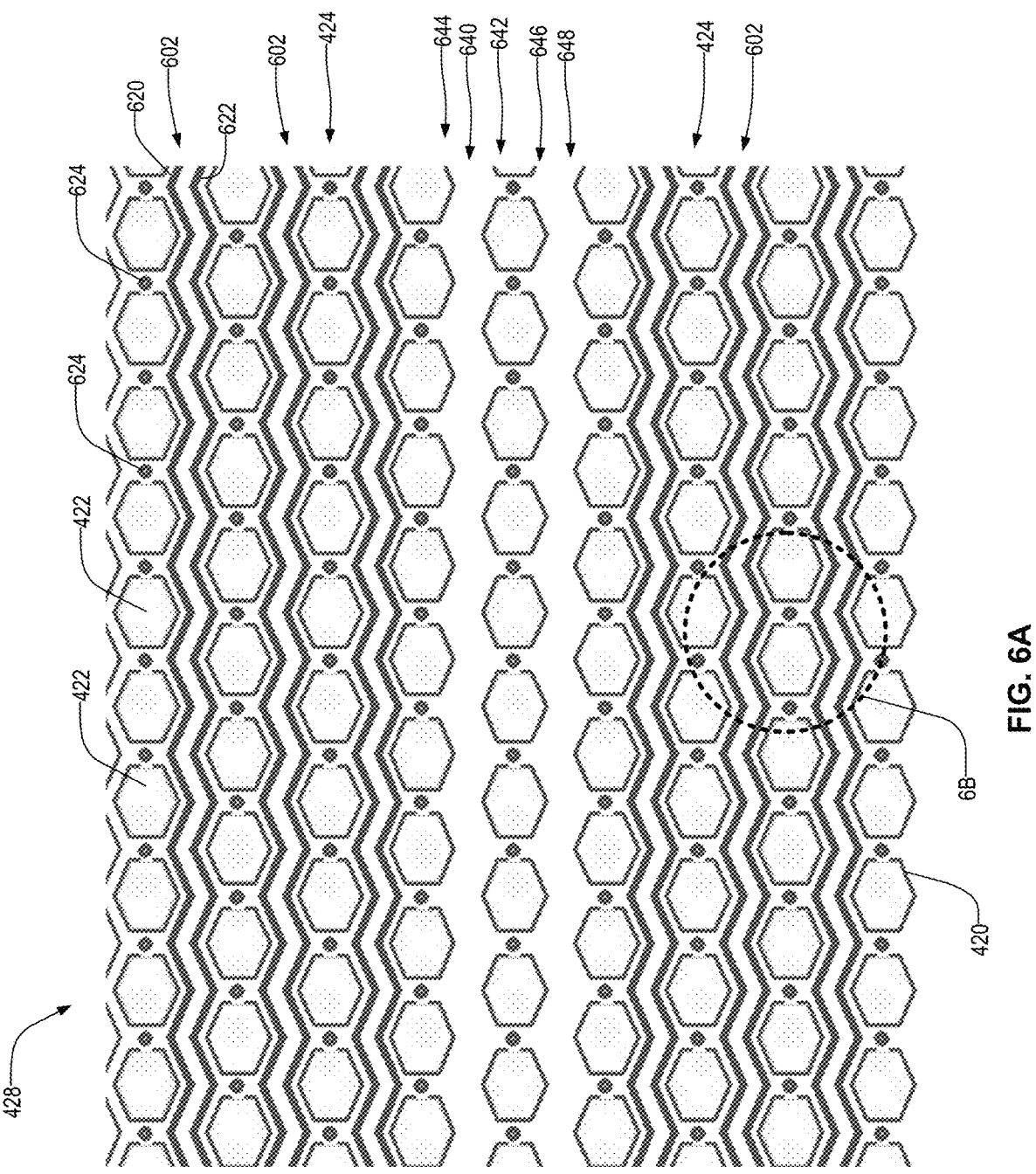
FIG. 6A is a partial, enlarged top view of the example circuit apparatus of FIG. 4.
Figure 6B:
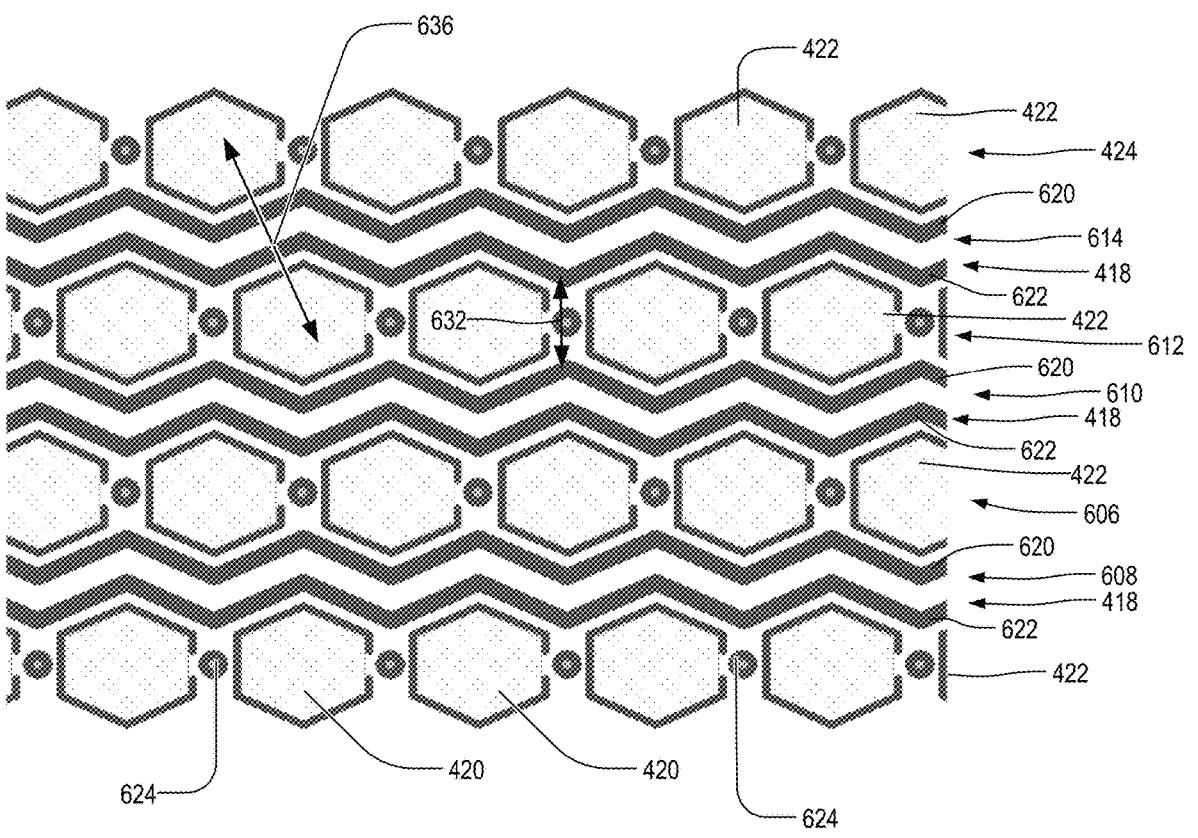
FIG. 6B is an enlarged portion of the example circuit apparatus of FIG. 6A.

FIG. 6A is an enlarged, partial view of the circuit apparatus 200 of FIGS. 1-5. FIG. 6B is an enlarged, partial view of the circuit apparatus 200 of FIG. 6A. Referring to FIGS. 6A and 6B, the openings 422 of the illustrated example provide the honeycomb pattern or the mesh pattern 428. The openings 422 of the illustrated example allow airflow to the respective fans 222a and 224a without blocking or impeding airflow to the fan inlets 304 and 306. The openings 422 of the illustrated example have a hexagonal shape. However, in other examples, the openings 422 can have a circular shape, a slot, an oblong shape and/or any other suitable shape.

The openings 422 of the illustrated example are positioned between (e.g., some of) the signal paths 402 and/or the traces 418. For example, the rows 424 of the openings 422 are positioned between respective rows 602 of the traces 418 in an alternating pattern. For example, referring to FIG. 6B, a first row 606 of the openings 422 is positioned between a first set 608 (e.g., a first row) of the traces 418 and a second set 610 (e.g., a second row) of the traces 418. A second row 612 of the openings 422 is positioned between the second set 610 of the traces 418 and a third set 614 (e.g., a third row) of the traces 418. Each set 608, 610 and 614 (e.g., or rows 600) of the traces 418 includes a first trace 620 to a carry a first differential signal (D+) and a second trace 622 adjacent the first trace 620 to carry a second differential signal (D–). For example, the first trace 620 and the second trace 622 can provide differential pair signal path for a thunderbolt connector, or a single ended signal path for other high speed input/output interfaces or connectors. Thus, the first row 606 of openings 422 is positioned between a first trace 620 of the first set 608 of the traces 418 and a second trace 620 of the second set 610 of traces 418. The second row 612 of openings 422 is positioned between the first trace 620 of the second set 608 of traces and the second trace 622 of the third set 614 of the traces 418, and so on.

The portions of the traces 418 (e.g., the first trace 620 and the second trace 622) formed adjacent the openings 422 have a non-linear shape. For example, the traces 418 of the illustrated example form a zigzag or weave (e.g., a fiber-weave) pattern within the matrix 428 defining the openings 422. Providing the traces 418 with a non-linear shape routes the traces 418 around the openings 422. In some examples, the zigzag routing of the traces 418 is preferred for high-speed I/O routing mitigates crosstalk from fiber-weave effect between the traces 418. In some examples, the traces 418 can be linear or straight (e.g., substantially straight) and/or any other shape(s). In some examples, as shown in FIGS. 6A and 6B, the traces 418 can have a first portion or length having a straight profile and a second portion or length having a zigzag pattern.

The traces 420 providing the ground signals are positioned between the rows 602 of traces 418 to mitigate signal crosstalk between the rows 602 of the traces 418. For example, the traces 420 can provide a ground guard trace along the first trace 620 and second trace 622. The traces 420 providing the ground signals are formed around a perimeter of the openings 422. The traces 420 of the illustrated example have a hexagonal shape. However, in other examples, the traces 420 can have a circular shape, a slot shape, an oblong shape and/or any other suitable shape. Thus, the traces 420 have a shape complementary to a shape defining a perimeter of the openings 422. To communicatively couple the traces 420 to each other (e.g., provide a ground plane), the traces 420 of the illustrated example are electrically coupled via one or more vias 624. For example, the vias 624 of the illustrated example extend in the z-direction 124 (e.g., in a thickness direction of the body 404).

The traces 418 (e.g., each of the rows 602) are spaced or separated by a distance 632 in the y-direction 122 (e.g., a vertical direction in the orientation of FIG. 6B). The distance 632 can be, for example, between approximately 670 micrometers and 900 micrometers. Specifically, the distance 632 is provided to mitigate crosstalk between the differential pairs (e.g., the traces 418). The spacing between the rows 602 defined by the distance 632 is often provided in conventional circuit boards to mitigate crosstalk. Thus, the openings 422 of the illustrated example are provided in an area of the body 404 that would otherwise be provided as mitigation spacing between the traces 418. The openings 422 of the illustrated example have a diameter 634 of approximately between 0.5 millimeters and 1.0 millimeter. A pitch 636 between the openings 422 is between approximately 1 millimeter and 1.5 millimeters. The openings 422 of the illustrated example do not have to be provided between the signal paths 402 (e.g., the traces 416-420). For example, a first area 640 between a fourth row 642 (e.g., a center row) of openings 422 and a fifth row 644 of openings 422 is a solid surface that does not have any signal paths 402 (e.g., the traces 418). Likewise, a second area 646 between the fourth row 642 of openings 422 and a sixth row 648 of openings 422 is a solid surface that does not have any signal paths 402 (e.g., the traces 418).

Figures 7, 8:
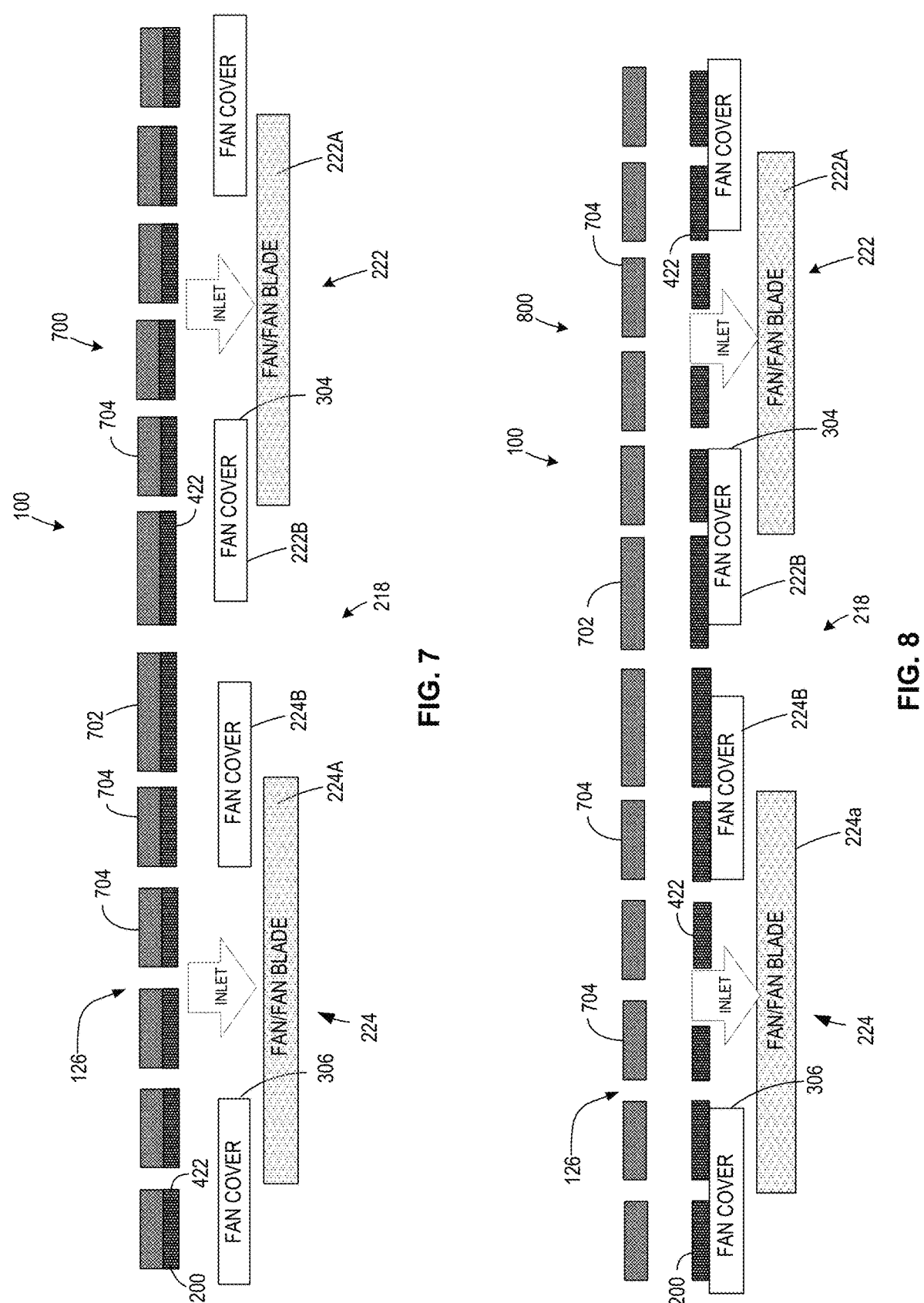
FIG. 7 is a cross-sectional, side view of the example electronic device of FIG. 1 showing the circuit apparatus in a first mounting configuration.
FIG. 8 is a cross-sectional, side view of the example electronic device of FIG. 1 showing the circuit apparatus in a second mounting configuration.

FIG. 7 is a partial, cross-sectional side view of the electronic device 100 of FIG. 1 showing the circuit apparatus 200 mounted in a first configuration 700. A first cover 702 (e.g., a C-cover or top cover, a chassis, a D-cover or bottom cover, etc.) of the first housing 102 of the electronic device 100 includes the air vent 126 that define a plurality of inlet vents 704. A second cover (e.g., a C-cover or top cover, a chassis, a D-cover or bottom cover) opposite the first cover 702 is removed for clarity. Specifically, the inlet vents 704 are in fluid communication with the dual fan assembly 218. The circuit apparatus 200 of the illustrated example extends at least partially across the dual fan assembly 218.

The circuit apparatus 200 of the illustrated example is coupled (e.g., mounted) to the first cover 702 of the electronic device 100 (e.g., in the first configuration 700). In the illustrated example, the circuit apparatus 200 is directly attached to the first cover 702. Specifically, the circuit apparatus 200 is coupled to the first cover 702 via adhesive, screws and/or any other fastener(s). In other words, the circuit apparatus 200 is positioned between the second cover 702 and the dual fan assembly 218 (e.g., in the z-direction 124).

When coupled to the second cover 702, the openings 422 of the circuit apparatus 200 align (e.g., coaxially and/or concentrically align) with the inlet vents 704 of the second cover 702. Specifically, respective ones of the openings 422 align with respective ones of the inlet vents 704. In this manner, the body 404 of the circuit apparatus 200 does not impede or block flow through the inlet vents 704. In other words, in the illustrated example, the body 404 of the circuit apparatus 200 does not cover or extend across (e.g., in airflow paths or openings defined by) the inlet vents 704. To facilitate alignment, the first cover 702 includes features or structures to receive and/or interface with the alignment pins 312 of the circuit apparatus 200. In the illustrated example, the circuit apparatus 200 is coupled to the first cover 702, which is a top or C-cover. However, in some examples, the circuit apparatus 200 can be coupled to a second cover or chassis such as, for example, a bottom or D-cover. In some examples, the electronic device 100 can include a plurality of circuit apparatus 200 coupled to the first cover 702, a second cover (e.g., a D-cover), the dual fan assembly 218, and/or any other frame, chassis and/or component(s) of the electronic device 100. Additionally, a size (e.g., diameter, an area) of the openings 422 of the circuit apparatus 200 of the illustrated example are substantially the same or identical relative to a size (e.g., a diameter, an area) of the inlet vents 704. However, in some examples, the openings 422 can have a different size (e.g., a diameter, an area) than the size of the inlet vents 704. For example, the openings 422 can have a diameter that is larger (e.g., by between 10 percent and 20 percent) compared to a diameter of the inlet vents 704.

In operation, the first fan 222a and the second fan 224a operate (e.g., rotate) to draw airflow 706 (e.g., ambient air) from the inlet vents 704. The airflow 706 flows through the openings 422 (e.g., airflow passageways) that are aligned with the inlet vents 704 and through the respective fan inlets 304 and 306 of the first fan module 222 and the second fan module 224. Additionally, the fans 222a, 224a draw heated air from the electronic components 204 from within the cavity 202 of the first housing 102. Thus, the openings 422 to enable airflow from outside of the first housing 102 into the cavity 202 through the body 404 of the circuit apparatus 200. The airflow exits the electronic device 100 through vent outlets formed in the second cover (e.g., the D-cover, a bottom cover) not shown in FIG. 7. In some examples, the circuit apparatus 200 can be structured such that the openings 422 extend only across the first fan inlet 304 and/or the second fan inlet 306 of the dual fan assembly 218. In some examples, the a single fan module is provided instead of the dual fan assembly 218. In some examples, a fan module is provided at an edge of the first housing 102. In some examples, an electronic device can include a plurality of fan modules (e.g., greater than two fans) and the electronic circuit apparatus 200 can be structured to extend across the fan modules.

FIG. 8 is a partial, cross-sectional side view of the electronic device 100 of FIG. 1 showing the circuit apparatus 200 mounted in a second configuration 800. In the second configuration, the circuit apparatus 200 is coupled (e.g., mounted) to the first fan housing 222b (e.g., a fan cover) and the second fan housing 224b (e.g., a fan cover) of the respective first fan module 222 and the second fan module 224. In the illustrated example, the circuit apparatus 200 is directly attached to the first fan housing 222b and the second fan housing 224b (e.g., via adhesive, screws and/or any other fastener(s)). In this manner, the body 404 of the circuit apparatus 200 is spaced away from the first cover 702 and does not impede or block flow through the inlet vents 704. In other words, in the illustrated example, the body 404 of the circuit apparatus 200 does not cover or extend across the inlet vents 704. Although when coupled to the first fan module 222 and the second fan module 224 the openings 422 of the circuit apparatus 200 align with the inlet vents 704 of the second cover 702, the openings 422 can be offset relative to the inlet vents 704. In this manner, the openings 422 do not have to be concentrically or coaxially aligned with the inlet vents 704 and the circuit apparatus 200 can be manufactured with less precision or tolerance. Additionally, in some examples, the alignment pins 312 are not required, thereby reducing manufacturing and/or assembly costs.

In operation, the first fan 222a and the second fan 224a operate (e.g., rotate) to draw airflow 706 (e.g., ambient air) from the inlet vents 704. The airflow 706 flows through the openings 422 that are aligned with the inlet vents 704 and through the respective fan inlets 304 and 306 of the first fan module 222 and the second fan module 224. Additionally, the fan draws heated air from the electronic components 204. The airflow exits the electronic device 100 through vent outlets formed in the second cover (e.g., the D-cover, a bottom cover) not shown in FIG. 7.

FIGS. 9, 10A, 10B, 11, 12A and 12B illustrate other example circuit apparatus 900, 1000, 1100, and 1210. Many of the components of the example circuit apparatus 900, 1000, 1100, and 1210 are substantially similar or identical to the components described above in connection with FIGS. 1-5, 6A, 6B, 7 and 8. As such, those components will not be described in detail again below. Instead, the interested reader is referred to the above corresponding descriptions for a complete written description of the structure and operation of such components. To facilitate this process, similar or identical reference numbers will be used for like structures in FIGS. 9, 10A, 10B, 11, 12A and 12B as used in FIGS. 1-5, 6A, 6B, 7 and 8. For example, the circuit apparatus 900, 1000, 1100, and 1210 include signal paths 402 (e.g., the first traces 414, the second traces 416, the third traces 418, and/or the fourth traces 420).

Figure 9:
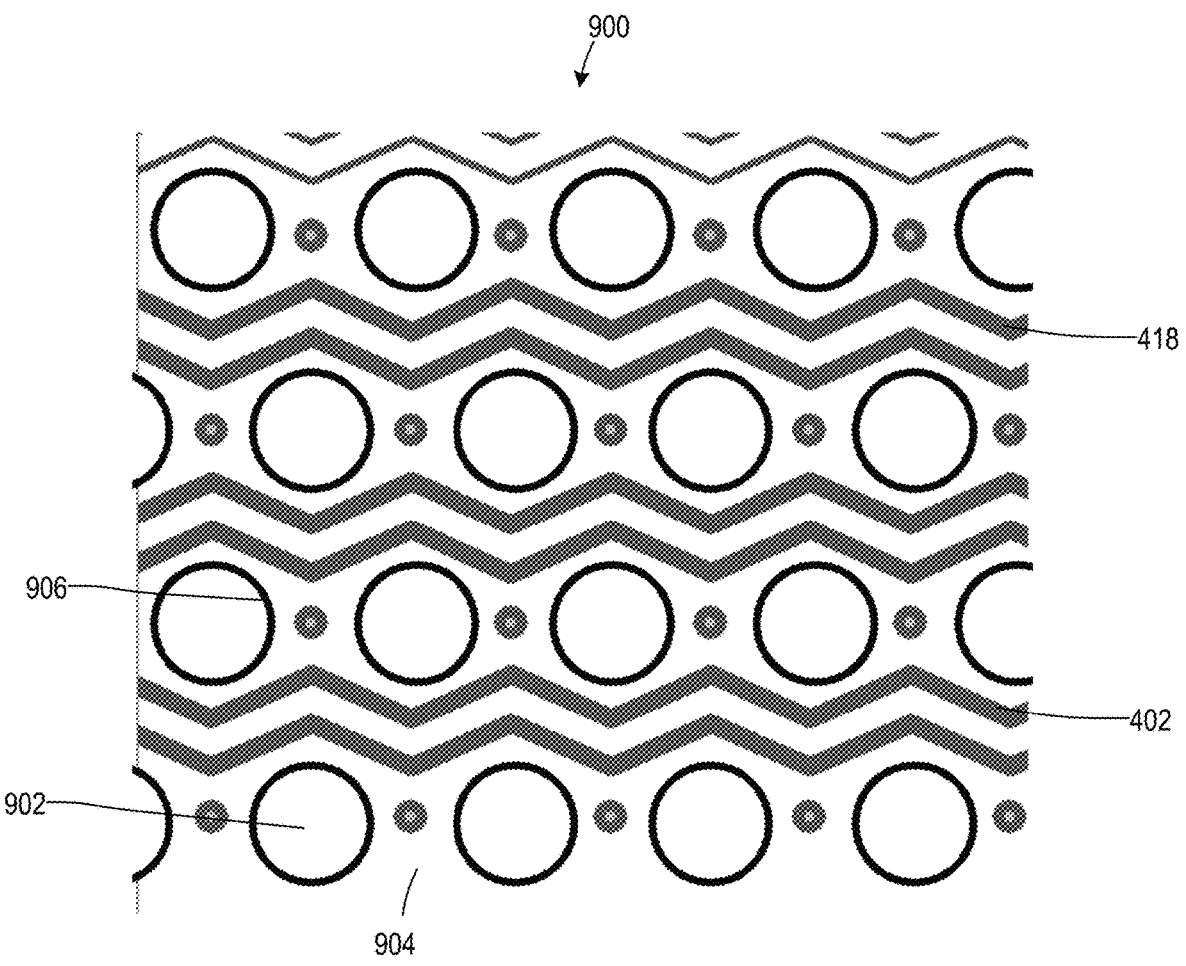
FIG. 9 is an enlarged, top view portion of another example circuit apparatus disclosed herein.

FIG. 9 is an enlarged, partial view of another example circuit apparatus 900 disclosed herein. The circuit apparatus 900 of the illustrated example is substantially similar to the circuit apparatus 200 of FIGS. 1-5, 6A, 6B, 7 and 8 except that openings 902 formed in a body 904 of the circuit apparatus 900 have a circular shape. However, the openings 902 can have any other suitable shape including rectangular, square, oblong, slotted, and/or any other shape.

Figures 10A, 10B:
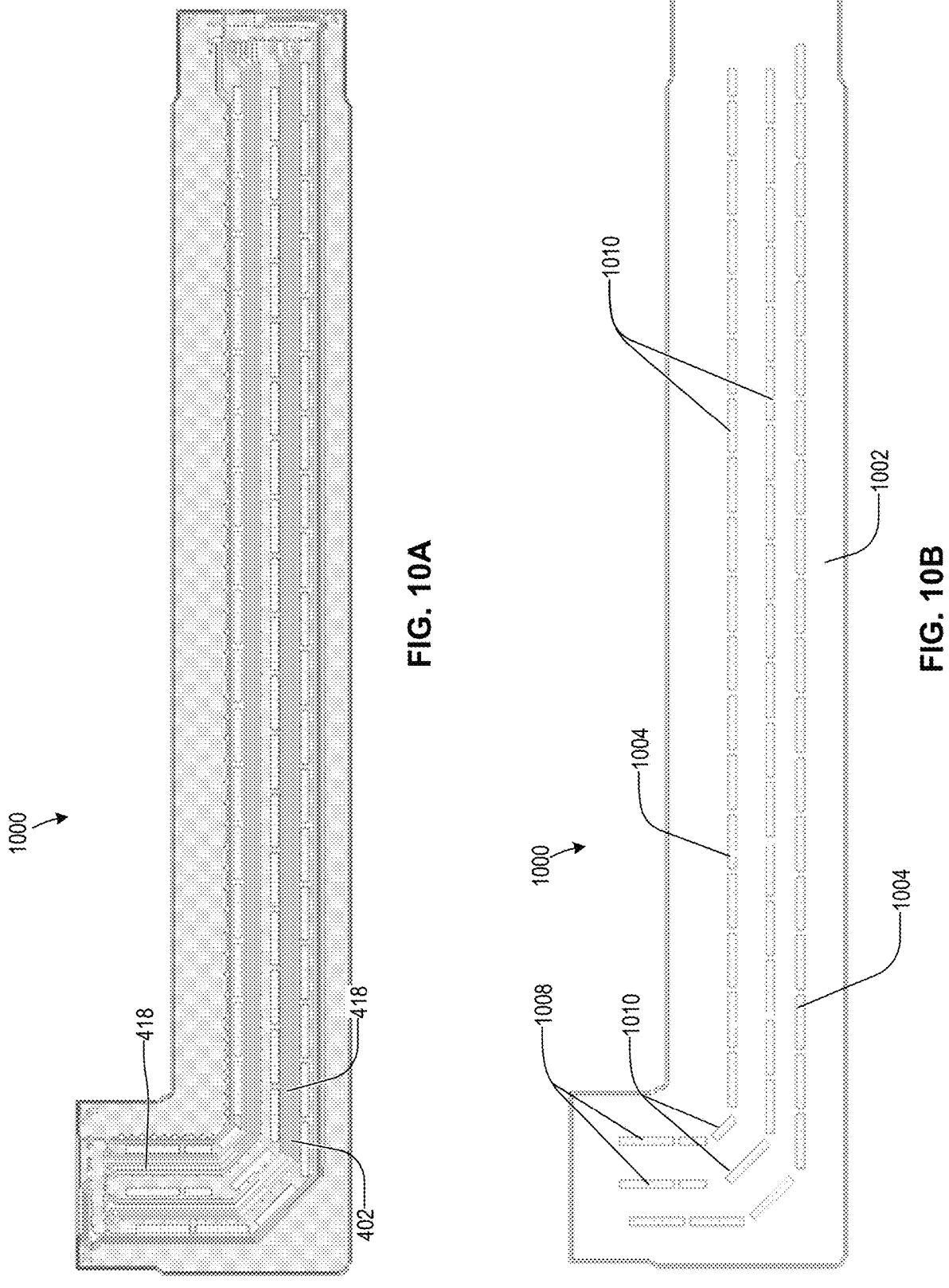
FIG. 10A is a top view of another example circuit apparatus disclosed herein.
FIG. 10B is a partial, top view of the circuit apparatus of FIG. 10A.

FIG. 10A is an enlarged, partial view of another example circuit apparatus 1000 disclosed herein. FIG. 10B is an enlarged, partial view of the circuit apparatus 1000 of FIG. 10A but shown without signal paths 402 for clarity. The circuit apparatus 1000 of the illustrated example is substantially similar to the circuit apparatus 200 of FIGS. 1-5, 6A, 6B, 7 and 8 except that a body 1002 of the circuit apparatus 1000 has a plurality of slots 1004. In the illustrated example, the slots 1004 are elongated slots. The slots are positioned between the traces 418 instead of the openings 422. The slots 1004 of the illustrated example have a rectangular shape. In the illustrated example, the slots 1004 have first rows 1006 of slots 1004 that extend in the x-direction 120, second rows 1008 of slots 1004 that extend in the y-direction 122, and third slots 1010 angled (e.g., extend in both the x-direction 120 and the y-direction 122) between the respective first rows 1006 and second rows 1008. The slots 1004 are positioned between the traces 418. In some examples, a circuit apparatus disclosed herein can include a combination of the openings 422 of FIGS. 1-5, 6A, 6B, the openings 902 of FIG. 9, the slots 1004 of FIGS. 10A and 10B, and/or another type (e.g., size or shape) opening or passageway.

Figure 11:
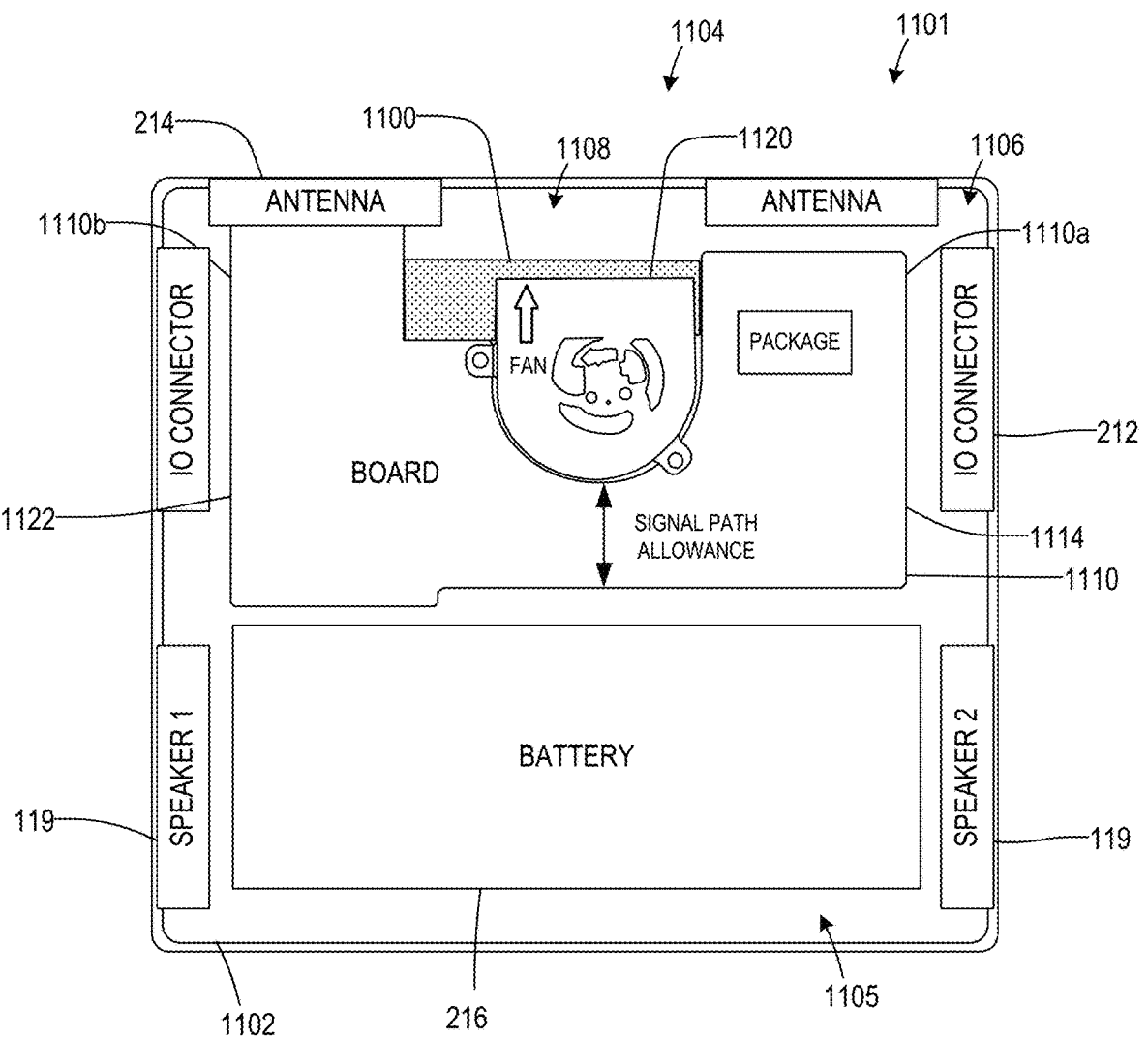
FIG. 11 is another example electronic device including another example circuit apparatus disclosed herein.

FIG. 11 is a schematic, bottom view of another electronic device 1101 including another example circuit apparatus 1100 disclosed herein. Specifically, FIG. 11 is a bottom view an example first housing 1102 of the electronic device 1104 with a cover removed to expose an internal cavity 1105 of the first housing 1102 that houses one or more electronic components 1106 of the electronic device 1104 including an example thermal management system 1108 disclosed herein. The electronic components 1106 include an example circuit board 1110 (e.g., a stack up), an example active cooling system 1112, example speakers 119, example input/output (I/O) connectors 212, example antennas 214, and an example battery 216. The electronic components 1106 can include other components not shown.

Specifically, the circuit board 1110 of the electronic device 1101 includes a cutout 1114 formed between a first circuit board portion 1110a and a second circuit board portion 1110b. A fan module 1120 of the active cooling system 1112 of the illustrated example is positioned at least partially between the first circuit board portion 1110a and the second circuit board portion 1110b. The circuit board 1110 of the illustrated example is a single, one-piece structure having the cutout 1114 to receive, at least partially, the fan module 1120.

The circuit apparatus 1100 of the illustrated example couples (e.g., electrically couples) to the first circuit board portion 1110a and the second circuit board portion 1110b. The circuit apparatus 1100 of the illustrated example extends at least partially across an inlet 1122 of the fan module 1120. To enable airflow to the inlet 1122 of the fan module 1120, the circuit apparatus 1100 of the illustrated example includes openings or passageways (e.g., substantially similar to the circuit apparatus 200, 900 and/or 1000 disclosed herein).

Thus, the circuit apparatus 1100 of FIG. 11 can be constructed substantially similar to the circuit apparatus 200, 900 and 1000 disclosed herein.

Figure 12A:
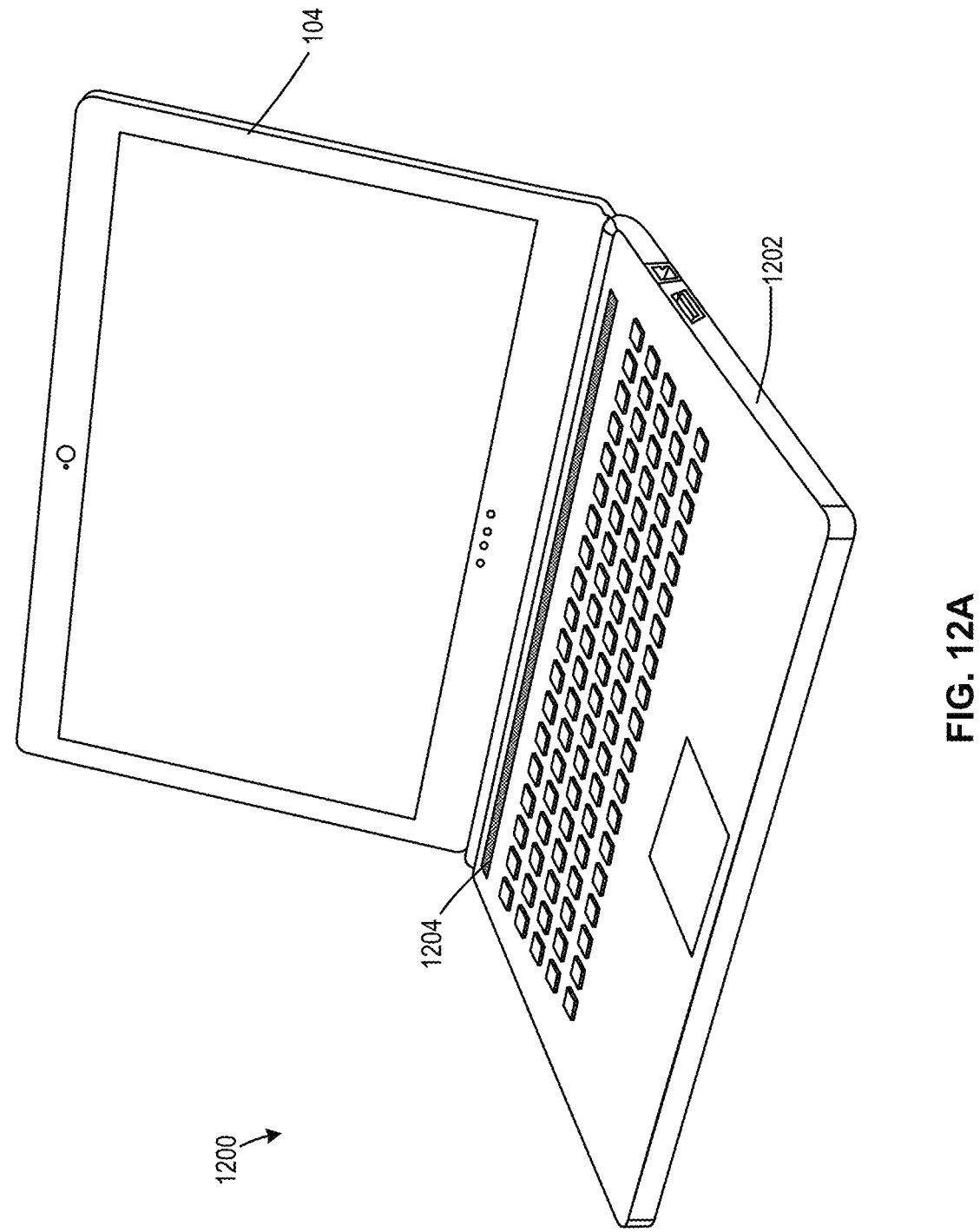
FIG. 12A is another example electronic device including another example circuit apparatus disclosed herein.

FIG. 12A is another example electronic device 1200 disclosed herein. The electronic device 1200 of the illustrated example includes a first housing 1202 and a second housing 104. The first housing 1202 is substantially similar to the first housing 102 of FIG. 1 except that the first housing 1202 of the illustrated example includes a secondary display 1204. Specifically, the secondary display 1204 of the illustrated example is a micro light emitting diode display (e.g., micro LED display). Specifically, the secondary display 1204 of the illustrated example is perforated to provide airflow to an active cooling system housed or located in the first housing 1202. The secondary display can present (e.g., illuminate) a user graphic input, indicia, icons, commands, function keys, alerts, and/or any other information.

Figure 12B:
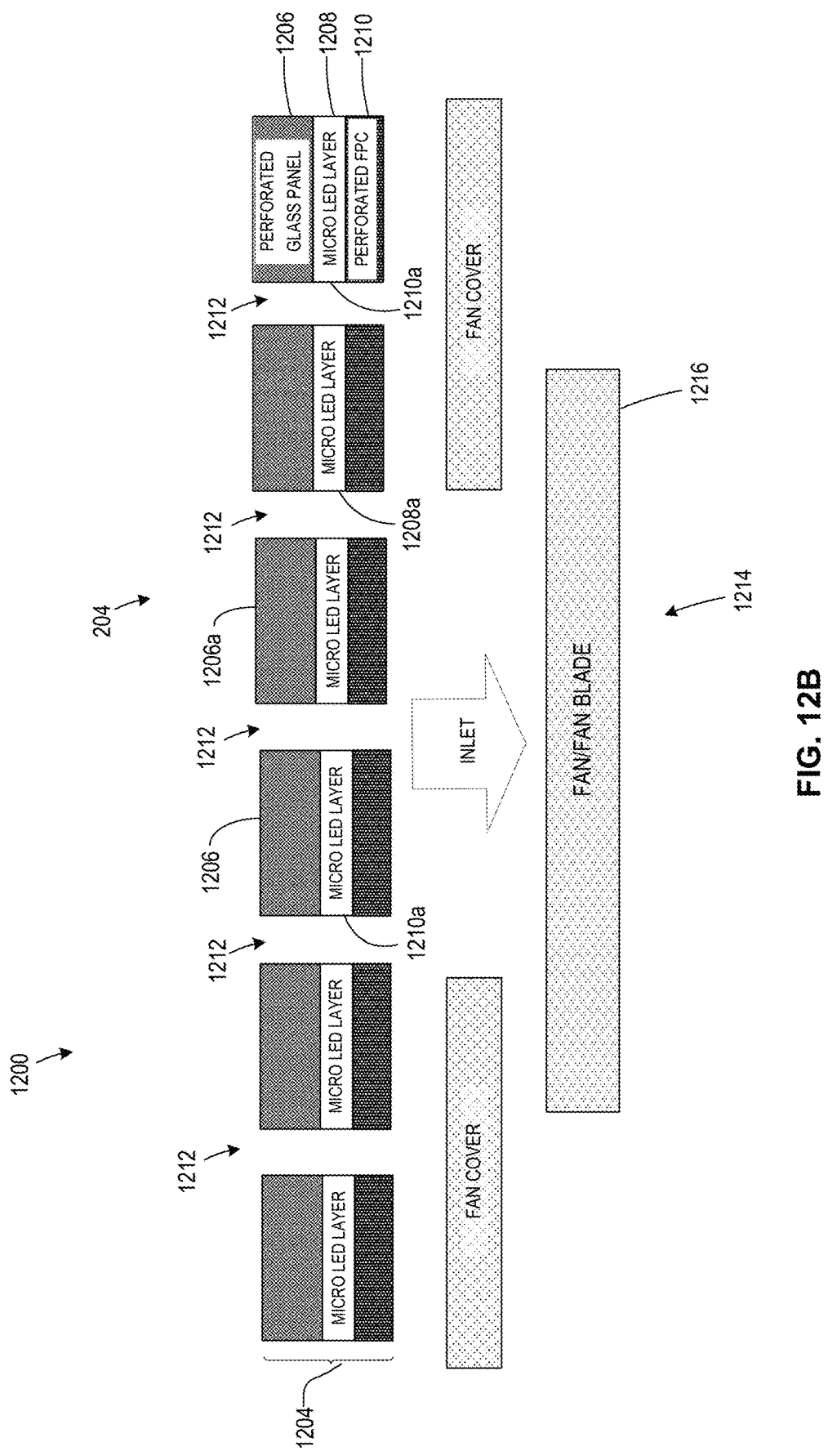
FIG. 12B is a cross-sectional side view of the electronic device of FIG. 12A.

FIG. 12B is a cross-sectional side view of the electronic device 1200 of FIG. 12A. In the illustrated example of FIG. 12B, the secondary display 1204 includes a glass layer 1206, an LED layer 1208, and an example circuit apparatus 1210 disclosed herein. Each of the glass layer 1206, the LED layer 1208 and the circuit apparatus 1210 of the illustrated example is perforated to provide inlet vents 1212. Specifically, the glass layer 1206 includes openings 1206a, the LED layer 1208 includes openings 1208a, and the circuit apparatus 1210 includes openings 1210a. The openings 1208a, 1210a and 1210a align (e.g., coaxially and/or concentrically align) to provide airflow passageways to a fan module 1214 located in the first housing 1202. The circuit apparatus 1210 of the illustrated example can be implemented substantially similar to the circuit apparatus 200, 900 and 1100 disclosed herein. In operation, a fan 1216 of the fan module 1214 rotates to draw airflow (e.g., ambient or atmospheric air) via the inlet vents 1212 formed in the secondary display 1204.

Figures 13, 14:
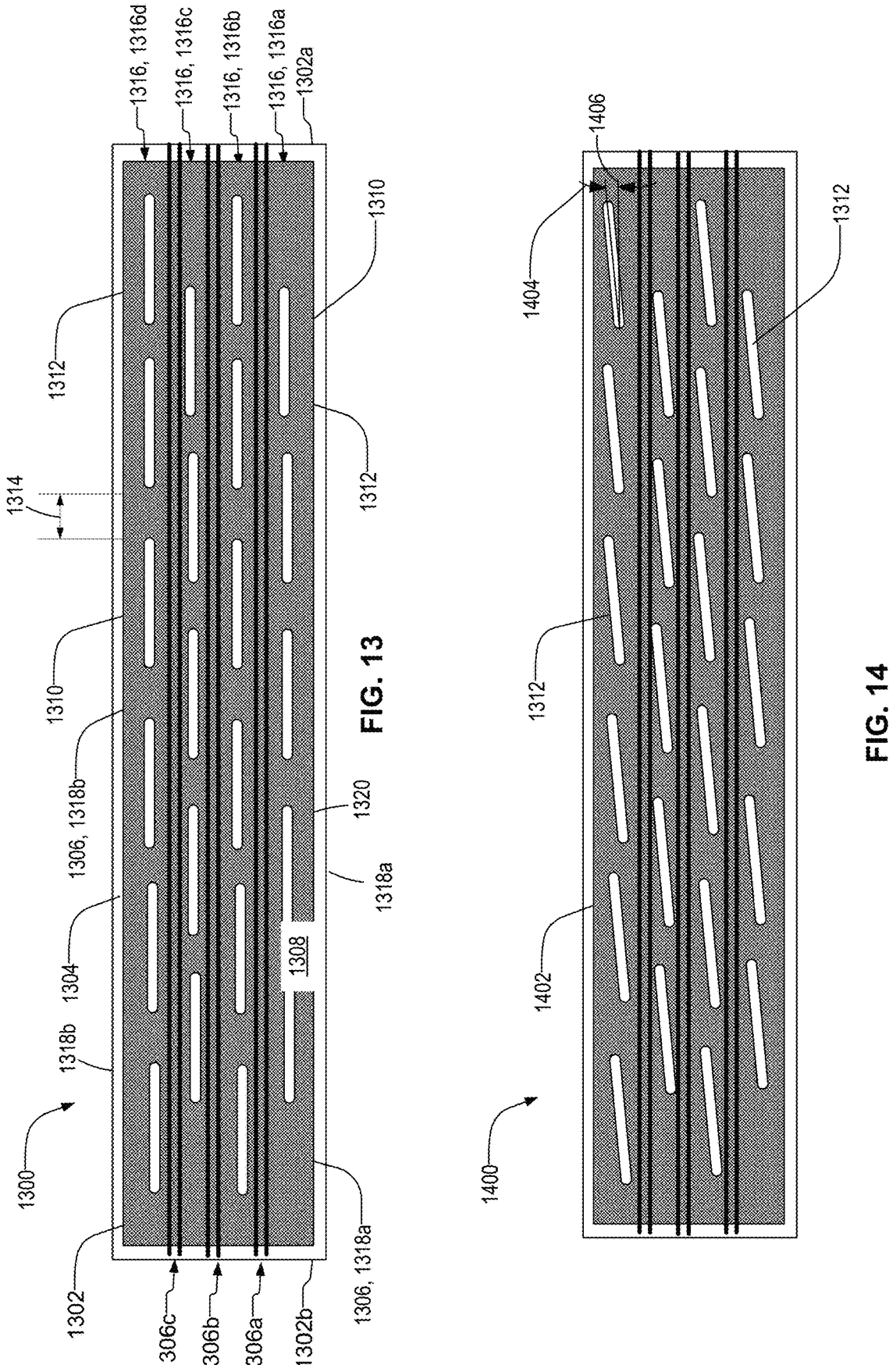
FIG. 13 is an enlarged, top view portion of another example circuit apparatus disclosed herein.
FIG. 14 is an enlarged, top view portion of another example circuit apparatus disclosed herein.

FIG. 13 is a top view of another example circuit apparatus 1300 disclosed herein. The circuit apparatus 1300 of the illustrated example includes signal paths 1302. The circuit apparatus 1300 of the illustrated example includes a body 1304 having a plurality of traces 1306 that define the signal paths 1302. The traces 1306 of the illustrated example extend between a first end 1302a of the body 1304 and a second end 1302b of the body 1304 opposite the first end 1302a. In some examples, the first end 1302a of the body 1304 includes a connector (e.g., the first connector 408 of FIG. 4) and the second end 1302b of the body 1304 includes a second connector (e.g., the second connector 410 of FIG. 4). The traces 1306 of the illustrated example have a straight or linear profile (e.g., in a horizontal direction in the orientation of FIG. 13, in the x-direction 124). However, in other examples, the traces 1306 can have zig-zag pattern, an arbitrary pattern, a curved or arcuate pattern, a combination of straight and zig-zag pattern, any combination thereof, and/or any other suitable pattern.

Additionally, the circuit apparatus 1300 of the illustrated example allows airflow between a first or upper surface 1308 of the body 1304 and a second or lower surface of the body 1304 opposite the first surface 1308. To allow airflow to pass through the body 1304, the circuit apparatus 1300 of the illustrated example includes a plurality of openings 1310 (e.g., cutouts, through holes, etc.). The openings 1310 of the illustrated example are slots 1312. The slots 1312 of the illustrated example are spaced apart by a distance 1314 and are substantially straight or linear in the x-direction 124. In other words, the slots 1312 of the illustrated example extend in a horizontal direction in the orientation of FIG. 13.

The slots 1312 of the illustrated example are positioned in rows 1316. For example, a first row 1316a of slots 1312 is positioned between a first edge 1318a of the body 1304 and a first trace 1304a, a second row 1316b of slots 1312 is positioned between the first trace 1306a and a second trace 1306b, a third row 1316c of slots 1312 is positioned the second trace 1304b and a third trace 1304c, and a fourth row 1316d of slots 1312 is positioned between the third trace 1304c and a second edge 1318b of the body 1304. Thus, each row 1316b and 1316c of slots 1312 is positioned between respective ones of the traces 1304a-c. Each of the rows 1316a-d of slots 1312 of the illustrated example has five or six slots 1312. However, in some examples, the rows 1316a-d can have any number of slots 1312. In some examples, one or more rows 1316 includes a single, elongated slot. In some examples, the openings 1310 or slots 1312 can have any other suitable shape including rectangular, square, oblong, and/or any other shape. In the illustrated example, each of the rows 1306a-c of traces 1306 include a first trace 1318a and a second trace 1318b (e.g., to support differential signals). However in some examples, each of the rows 1306a-c can include a single trace or more than two traces. In some examples, the circuit apparatus 1300 includes a ground trace or path to reduce crosstalk between the traces 1306. In some examples, a distance or spacing 1320 (e.g., in the vertical direction in the orientation of FIG. 13, or the y-direction 122) between the traces 1306 is sufficient to mitigate crosstalk and, thereby, maintain signal integrity. For example, the spacing can be approximately 0.65 micrometers.

FIG. 14 is an enlarged, partial view of another example circuit apparatus 1400 disclosed herein. The circuit apparatus 1400 of the illustrated example is substantially similar to the circuit apparatus 1300 of FIG. 13 except the slots 1312 formed in a body 1402 of the circuit apparatus 1400 are positioned at an angle 1404 relative to horizontal 1406. For example, the angle 1404 can be between approximately 10 degrees and 80 degrees relative to horizontal 1406. In the illustrated example, the angle 1404 is approximately 30 degrees relative to horizontal 1406.

The foregoing examples of the circuit apparatus 200, 900, 1000, 1100, 1210, 1300, 1400 can be circuit boards that provide airflow features for use in conjunction with a thermal management system of an electronic device. Although each example circuit apparatus disclosed above have certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

Example methods, apparatus, systems, and articles of manufacture to provide circuit apparatus are disclosed herein. From the foregoing apparatus, the example circuit apparatus 200, 900, 1000, 1100, 1210, 1300 and 1400 disclosed herein provide electrical connection between the system boards in the an electronic system (e.g., a personal computer, a laptop, a mobile device, etc.) to conserve space (e.g., in a y-direction) and that include passageways to provide thermal performance for the electronic system and/or provide flexibility for improving optimization of component space of an electronic system.

Further examples and combinations thereof include the following:

Example 1 includes a body including a plurality of first traces formed on the body, and a plurality of openings formed through the body and located between respective ones of the first traces. The openings provide airflow to a fan module of an electronic device through the body of the circuit apparatus.

Example 2 includes the example of claim 1, where the body includes an area that includes the plurality of openings.

Example 3 includes the example of any one of claims 1 and 2, where the area has a rectangular shape.

Example 4 includes the example of any one of claims 1-3, where the body and the openings form a mesh pattern.

Example 5 includes the example of any one of claims 1-4, where the openings are slots.

Example 6 includes the example of any one of claims 1-5, where the openings have at least one of hexagonal or circular shapes.

Example 7 includes the example of any one of claims 1-6, where the first traces have a zig-zag shape.

Example 8 includes the example of any one of claims 1-7, where a first row of openings is positioned between a first one of the first traces and a second one of the first traces.

Example 9 includes the example of any one of claims 1-8, where the first row of openings includes at least five openings.

Example 10 includes the example of any one of claims 1-9, further including a plurality of second traces provided about perimeters of the respective openings.

Example 11 includes the example of any one of claims 1-10, where the second traces have at least one of hexagonal or circular shapes.

Example 12 includes an electronic device including a housing including air vents, a fan module located in the housing, and a circuit apparatus located in the housing and extending at least partially across the fan module. The circuit apparatus including one or more passageways formed therethrough to allow airflow from the air vents to the fan module.

Example 13 includes the electronic device of example 12, where the circuit apparatus includes a plurality of traces, and where the passageways are formed between a first set of the traces and a second set of the traces spaced from the first set of the traces.

Example 14 includes the electronic device of any one of examples 12-13, where the passageways are formed in an area of the circuit apparatus, the passageways being formed in rows and columns in a grid-like pattern.

Example 15 includes the electronic device of any one of examples 12-14, where the area has a rectangular shape.

Example 16 includes the electronic device of any one of examples 12-15, where the passageways extend only across a fan inlet of the fand module.

Example 17 includes the electronic device of any one of examples 12-16, where the circuit apparatus is attached to the housing such that the passageways of the circuit apparatus align with respective inlet vents of the housing.

Example 18 includes the electronic device of any one of examples 12-17, where the circuit apparatus is attached to a fan housing of the fan module.

Example 19 includes an electronic device including a first circuit board, a second circuit board, a fan module positioned between the first circuit board and the second circuit board, and a flexible circuit board positioned between the first circuit board and the second circuit board and extending across the fan module. The flexible circuit board including a plurality of perforations between traces formed on the flexible circuit board. The perforations to enable airflow from external of a housing of the electronic device, through the flexible circuit board, and to a fan inlet of the fan module.

Example 20 includes the electronic device of example 19, where the perforations are formed in a honeycomb pattern.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A circuit apparatus comprising:
a body including:
a plurality of first traces on the body; and
a plurality of openings through the body and located between respective ones of the first traces, the openings to provide an airflow passageway to a fan module of an electronic device through the body of the circuit apparatus.

2. The circuit apparatus of claim 1, wherein the body includes an area that includes the plurality of openings.

3. The circuit apparatus of claim 2, wherein the area has a rectangular shape.

4. The circuit apparatus of claim 1, wherein the body and the openings form a mesh pattern.

5. The circuit apparatus of claim 1, wherein the openings are slots.

6. The circuit apparatus of claim 1, wherein the openings have at least one of hexagonal or circular shapes.

7. The circuit apparatus of claim 1, wherein the first traces have a zig-zag shape.

8. The circuit apparatus of claim 1, wherein a first row of openings is between a first one of the first traces and a second one of the first traces.

9. The circuit apparatus of claim 8, wherein the first row of openings includes at least five openings.

10. The circuit apparatus of claim 1, further including a plurality of second traces provided about perimeters of the respective openings.

11. The circuit apparatus of claim 10, wherein the second traces have at least one of hexagonal or circular shapes.

12. An electronic device comprising:
a housing including air vents;
a fan module located in the housing; and
a circuit apparatus located in the housing and extending at least partially across the fan module, the circuit apparatus including one or more passageways formed therethrough to allow airflow from the air vents in the housing to the fan module.

13. The electronic device as defined in claim 12, wherein the circuit apparatus includes a plurality of traces, wherein a first set of the traces and a second set of the traces spaced from the first set of the traces.

14. The electronic device as defined in claim 12, wherein the passageways are in an area of the circuit apparatus, the passageways being in rows and columns in a grid-like pattern.

15. The electronic device as defined in claim 14, wherein the area has a rectangular shape.

16. The electronic device as defined in claim 14, wherein the passageways extend only across a fan inlet of the fan module.

17. The electronic device as defined in claim 14, wherein the circuit apparatus is attached to the housing such that the passageways of the circuit apparatus align with respective inlet vents of the housing.

18. The electronic device as defined in claim 14, wherein the circuit apparatus is attached to a fan housing of the fan module.

19. An electronic device comprising:
a first circuit board;
a second circuit board;
a fan module between the first circuit board and the second circuit board; and
a flexible circuit board between the first circuit board and the second circuit board and extending across the fan module, the flexible circuit board including a plurality of perforations between traces on the flexible circuit board, the perforations to enable airflow from outside of a housing of the electronic device, through the flexible circuit board and to a fan inlet of the fan module.

20. The electronic device of claim 19, wherein the perforations are in a honeycomb pattern.

* * * * *